US009231103B2

(12) United States Patent
Pellizzer et al.

(10) Patent No.: US 9,231,103 B2
(45) Date of Patent: Jan. 5, 2016

(54) VERTICAL MOSFET TRANSISTOR, IN PARTICULAR OPERATING AS A SELECTOR IN NONVOLATILE MEMORY DEVICES

(71) Applicant: Micron Technology, Inc., Boise, ID (US)

(72) Inventors: Fabio Pellizzer, Boise, ID (US); Agostino Pirovano, Milan (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/277,150

(22) Filed: May 14, 2014

(65) Prior Publication Data

US 2014/0239244 A1    Aug. 28, 2014

Related U.S. Application Data

(63) Continuation of application No. 12/862,624, filed on Aug. 24, 2010, now Pat. No. 8,766,344, which is a continuation of application No. 11/411,982, filed on Apr. 26, 2006, now Pat. No. 7,847,329.

(30) Foreign Application Priority Data

Apr. 27, 2005   (EP) .................................. 05425261

(51) Int. Cl.
*H01L 29/78*   (2006.01)
*H01L 27/24*   (2006.01)
*H01L 29/423*   (2006.01)
(Continued)

(52) U.S. Cl.
CPC ........ *H01L 29/7827* (2013.01); *H01L 27/2454* (2013.01); *H01L 29/42392* (2013.01); *H01L 29/66666* (2013.01); *H01L 45/06* (2013.01); *H01L 45/144* (2013.01); *G11C 13/0004* (2013.01); *H01L 29/665* (2013.01); *H01L 45/126* (2013.01); *H01L 45/1233* (2013.01)

(58) Field of Classification Search
CPC .............................. H01L 45/06; H01L 45/144
See application file for complete search history.

(56) References Cited

U.S. PATENT DOCUMENTS 5,023,192 A   6/1991   Josquin et al.
5,250,828 A   10/1993   Honma
(Continued)

FOREIGN PATENT DOCUMENTS

EP           1717861           11/2006

OTHER PUBLICATIONS

Fitch, J, et al., "Multi-Pillar Surrounding Gate Transistor with Advanced Isolation", Motorola Inc. Technical Developments, 17, (Dec. 1992), 77-81.

(Continued)

*Primary Examiner* — Allen Parker
(74) *Attorney, Agent, or Firm* — Schwegman Lundberg & Woessner, P.A.

(57) ABSTRACT

A vertical MOSFET transistor is formed in a body of semiconductor material having a surface. The transistor includes a buried conductive region of a first conductivity type; a channel region of a second conductivity type, arranged on top of the buried conductive region; a surface conductive region of the first conductivity type, arranged on top of the channel region and the buried conductive region; a gate insulation region, extending at the sides of and contiguous to the channel region; and a gate region extending at the sides of and contiguous to the gate insulation region.

20 Claims, 14 Drawing Sheets

(51) Int. Cl.
*H01L 45/00* (2006.01)
*H01L 29/66* (2006.01)
*G11C 13/00* (2006.01)

(56) References Cited

U.S. PATENT DOCUMENTS

| | | | |
|---|---|---|---|
| 5,801,417 | A | 9/1998 | Tsang et al. |
| 5,981,350 | A | 11/1999 | Geusic et al. |
| 5,991,225 | A | 11/1999 | Forbes et al. |
| 6,077,745 | A | 6/2000 | Burns, Jr. et al. |
| 6,191,446 | B1 | 2/2001 | Gardner |
| 6,465,325 | B2 | 10/2002 | Ridley et al. |
| 6,525,363 | B1 | 2/2003 | Willer et al. |
| 6,559,491 | B2 | 5/2003 | Forbes et al. |
| 6,740,921 | B2 | 5/2004 | Matsuoka |
| 6,912,153 | B2 | 6/2005 | Tihanyi |
| 6,984,580 | B2 | 1/2006 | Dostalik et al. |
| 7,052,941 | B2 | 5/2006 | Lee |
| 7,116,593 | B2 | 10/2006 | Hanzawa |
| 7,847,329 | B2 | 12/2010 | Pellizzer |
| 2001/0052614 | A1 | 12/2001 | Ishibashi |
| 2002/0109173 | A1 | 8/2002 | Forbes et al. |
| 2003/0146469 | A1 | 8/2003 | Matsuoka et al. |
| 2003/0219924 | A1* | 11/2003 | Bez et al. ............ 438/102 |
| 2004/0113207 | A1 | 6/2004 | Hsu et al. |
| 2004/0114317 | A1 | 6/2004 | Chiang et al. |
| 2004/0145938 | A1 | 7/2004 | Tihanyi |
| 2004/0184331 | A1 | 9/2004 | Hanzawa et al. |
| 2004/0222529 | A1 | 11/2004 | Dostalik et al. |
| 2004/0262635 | A1 | 12/2004 | Lee |
| 2010/0320432 | A1 | 12/2010 | Pellizzer et al. |

OTHER PUBLICATIONS

Hofmann, F, et al., "CVD-EPI MOS Transistor with a 65 nm Vertical Channel", In Proceedings of the Int'l. Conf. on Solid State Devises & Materials, Tokyo, Japan, (Aug. 21, 1995).

Hofmann, F., et al., "CVD-EPI MOS Transistors with a 65 nm Vertical Channel", Solid state devices and materials—International conference, Solid State Devices and Materials, (1995), 46-48.

Pein, H., et al., "A 3-D sidewall flash EPROM cell and memory array", IEEE Electron Device Letters, 14(8), (1993), 415-417.

Pein, H., et al., "Performance of the 3-D PENCIL flash EPROM cell and memory array", IEEE Transactions on Electron Devices, 42(11), (1995), 1982-1991.

* cited by examiner

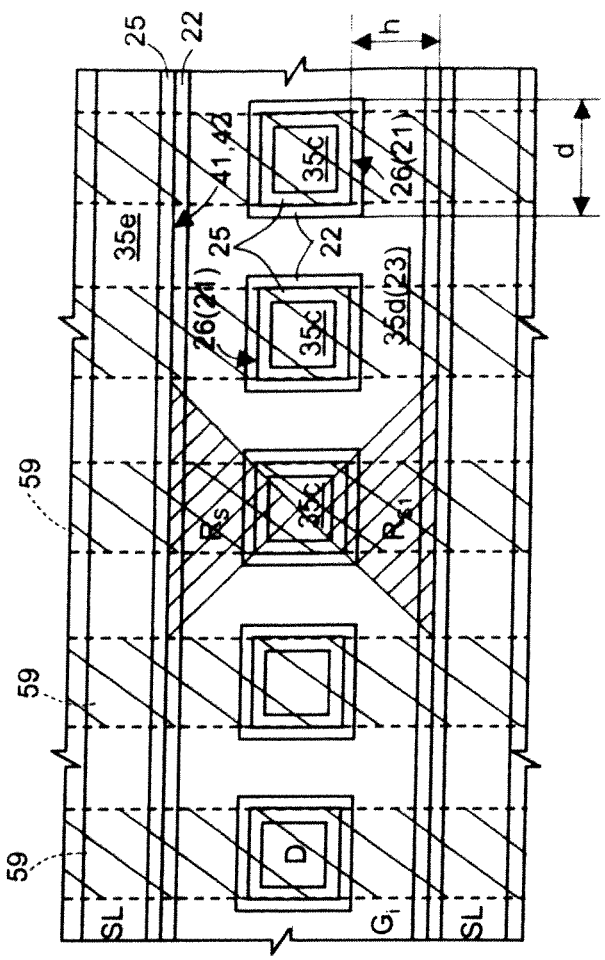
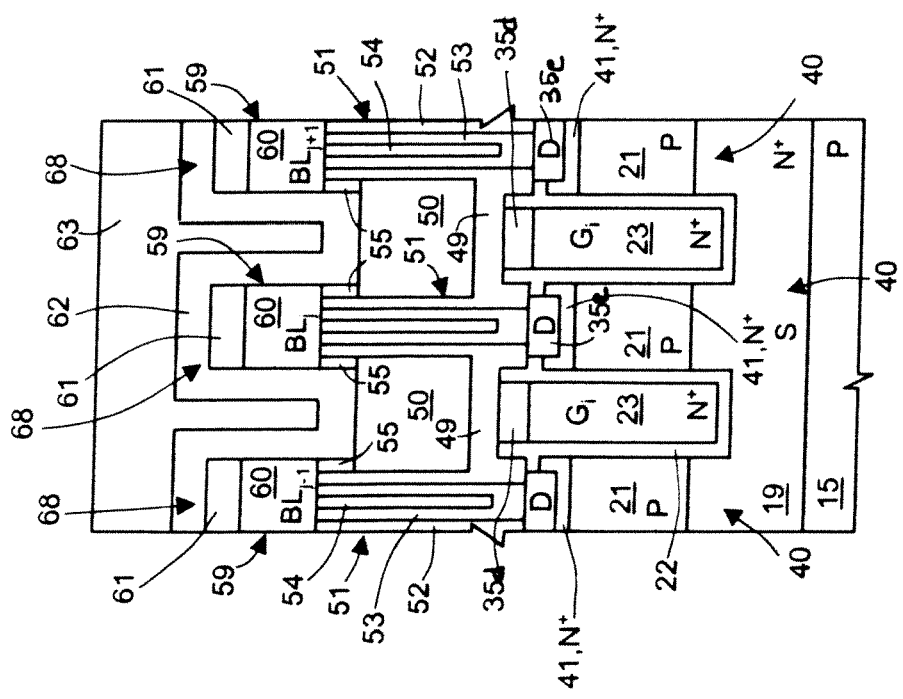
Fig. 19
Fig. 18

VERTICAL MOSFET TRANSISTOR, IN PARTICULAR OPERATING AS A SELECTOR IN NONVOLATILE MEMORY DEVICES

RELATED APPLICATIONS

The present application is a continuation of co-pending U.S. patent application Ser. No. 11/411,982, filed on Apr. 26, 2006.

BACKGROUND OF INVENTION

1. Field of Invention

The subject of the present invention is a vertical MOSFET transistor, in particular operating as a selector in nonvolatile memory devices.

The following description relates to a MOSFET transistor designed to operate as selector for a phase-change memory, without, however, being limited to this type of application. In particular, the MOSFET transistor according to the invention can be advantageously used also for other types of nonvolatile memories or other common-source-region applications.

2. Description of the Related Art

As is known, phase-change memoires (PCMs) exploit the characteristics of materials that have the property of switching between two phases that have different electrical characteristics. For example, these materials can switch between an amorphous, disorderly phase and a crystalline or polycrystalline, orderly phase, and the two phases are associated to resistivities of markedly different values.

Currently, the alloys of group VI of the periodic table, such as Te or Se, referred to as calcogenides or calcogenic materials, may advantageously be used in phase-change memories. The currently most promising calcogenide is formed by a Ge, Sb, and Te alloy ($Ge_2Sb_2Te_5$), which is currently widely used for storing information in overwritable disks.

In phase-change memories comprising calcogenic elements as storage elements, the memory cells are arranged in rows and columns, as illustrated in FIG. 1. The memory array 1 of FIG. 1 comprises a plurality of memory cells 2, arranged in the crossing points between rows 6 (also referred to as wordlines) and columns 5 (also referred to as bitlines) and each of which includes a memory element 3 of a phase-change type and a selection element 4.

In each memory cell 2, the memory element 3 has a first terminal connected to an own wordline 6 and a second terminal connected to a first conduction terminal of an own selection element 4. The selection element 4 has a second terminal connected to a bitline 5. In another solution, the memory element 3 and the selection element 4 of each cell 2 can be exchanged.

Currently, as selection elements bipolar transistors, planar MOS transistors, or diodes have been proposed.

A method of manufacturing a phase-change memory device including a diode as a selection element is described in US 20031021992 4. Another method for obtaining a memory comprising a bipolar transistor as a selection element is described in.

Phase-change memories using selectors made as bipolar components have the problem that they dissipate even when they are in the non-selected or off state thereby, as a whole, giving rise to a non-negligible consumption. Phase-change memories that use selectors made with planar MOS technology have the problem that they occupy a non-negligible area.

BRIEF SUMMARY OF THE INVENTION

One embodiment of the invention provides a MOSFET transistor that will solve the problems of known devices, in particular as regards dissipation and occupied area.

According to the present invention, a vertical MOSFET transistor, a memory array, and the corresponding methods of manufacturing are provided as defined in claims 1, 10, 13 and 19, respectively.

One embodiment of the present invention provides a vertical MOSFET transistor that includes a body of semiconductor material having a surface. Positioned in the body is a buried conductive region of a first conductivity type; a channel region of a second conductivity type, arranged on top of the buried conductive region; and a surface conductive region of the first conductivity type, arranged on top of the channel region and the buried conductive region. A gate insulation region extends at sides of and contiguous to the channel region; and a gate region extends at sides of and contiguous to the gate insulation region.

BRIEF DESCRIPTION OF THE SEVERAL VIEWS OF THE DRAWINGS

For an understanding of the present invention, preferred embodiments thereof are now described, purely by way of non-limiting example, with reference to the attached drawings, wherein:

FIG. 18 is a cross-section perpendicular to FIG. 17, taken along section line XVIII-XVIII of FIG. 17;

FIG. 19 is a top plan view of the structure of FIG. 18;

DETAILED DESCRIPTION OF THE INVENTION

The following figures show the cross section through a wafer 13 formed initially by a substrate 15 of monocrystalline silicon, here of P type. In particular, the left-hand part of the wafer 13 (first area 10) regards the manufacture of a vertical MOSFET transistor, while the right-hand part (second area 11) regards the manufacturing of a standard MOSFET planar transistor.

Figure 1:
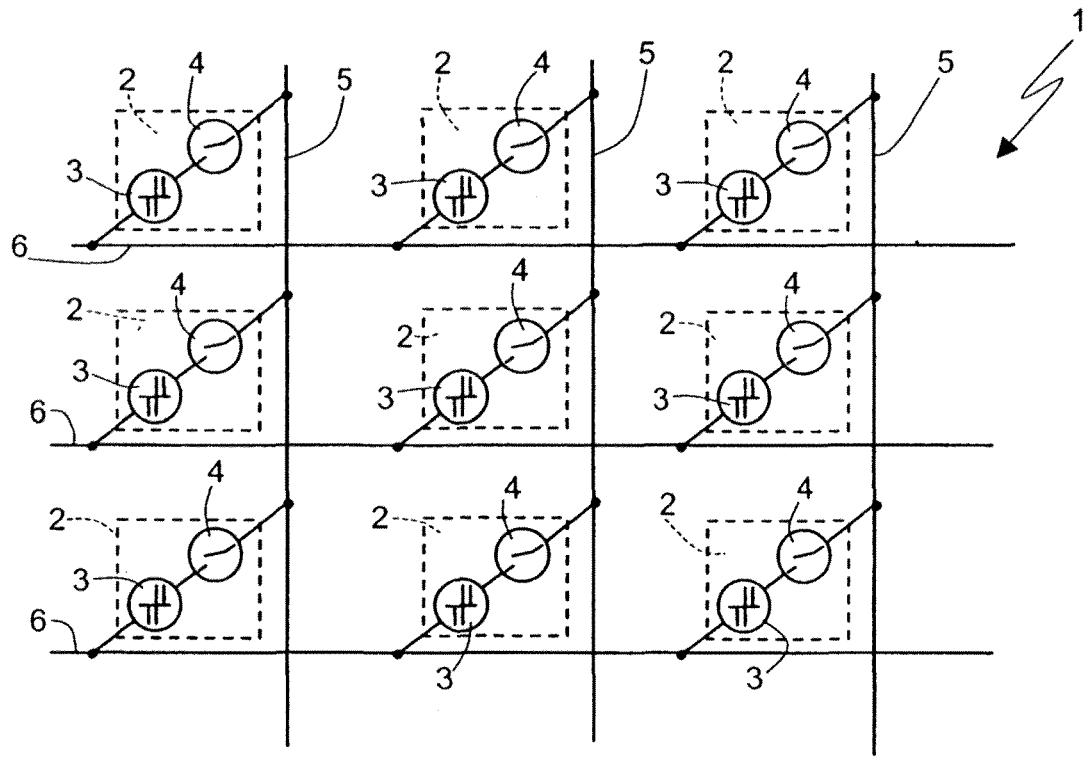
FIG. 1 is a circuit diagram of a known array of phase-change memory cells.
Figure 2:
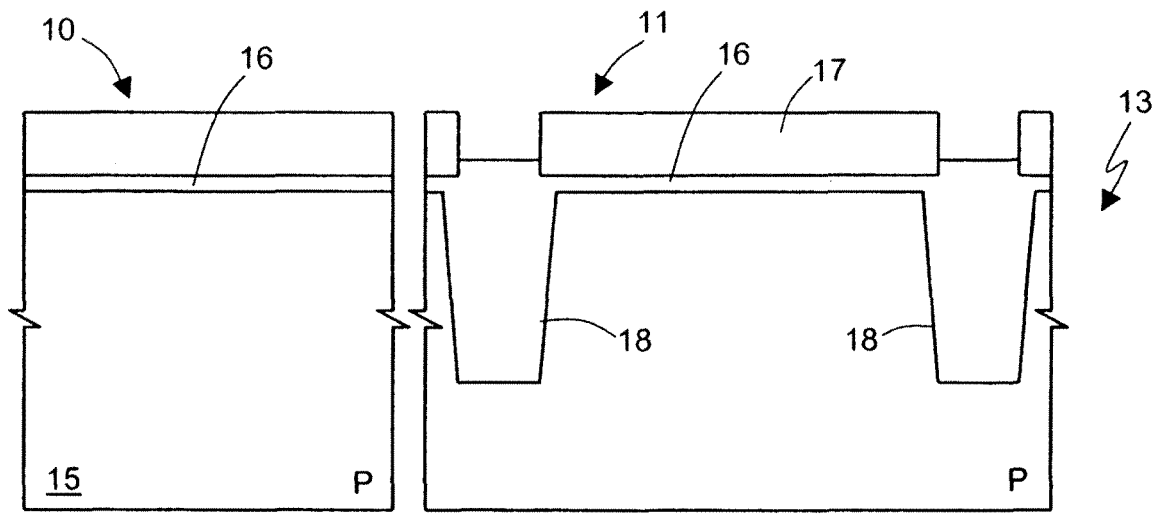
FIGS. 2-4 show cross-sections regarding an embodiment of the invention, in successive process steps.

With reference to FIG. 2, electrical-insulation regions are provided in the second area ▌1, within the substrate 15, here using an STI (Shallow-Trench Insulation) technique. To this end, in a per se known manner, a pad-oxide layer 16 is first grown or deposited, then a first nitride layer 17 is deposited, the layers 16 and 17 are removed selectively, and a trench etch is performed. The trenches thus obtained are filled with dielectric material so as to form insulation regions 18.

Figure 3:
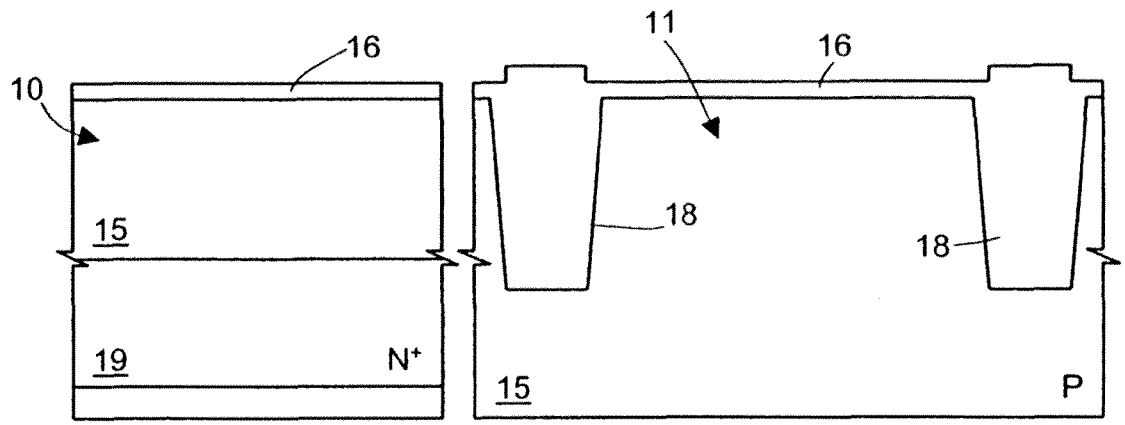

Next (FIG. 3), the first nitride layer 17 is removed and a masked implantation of dopant ions of an N type is performed only in the first area 10 so as to form a buried layer 19 of an N+ type.

Figure 4:
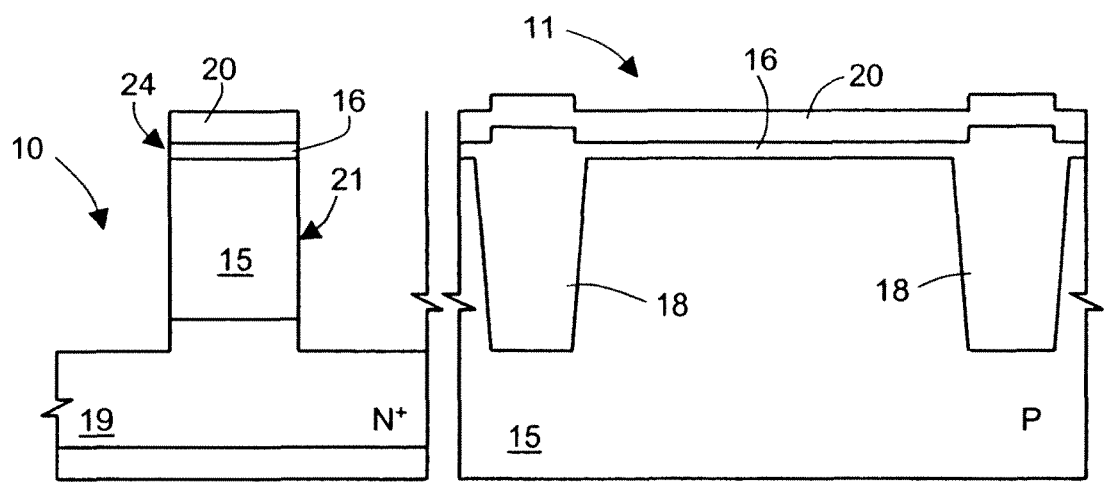
Figure 5:
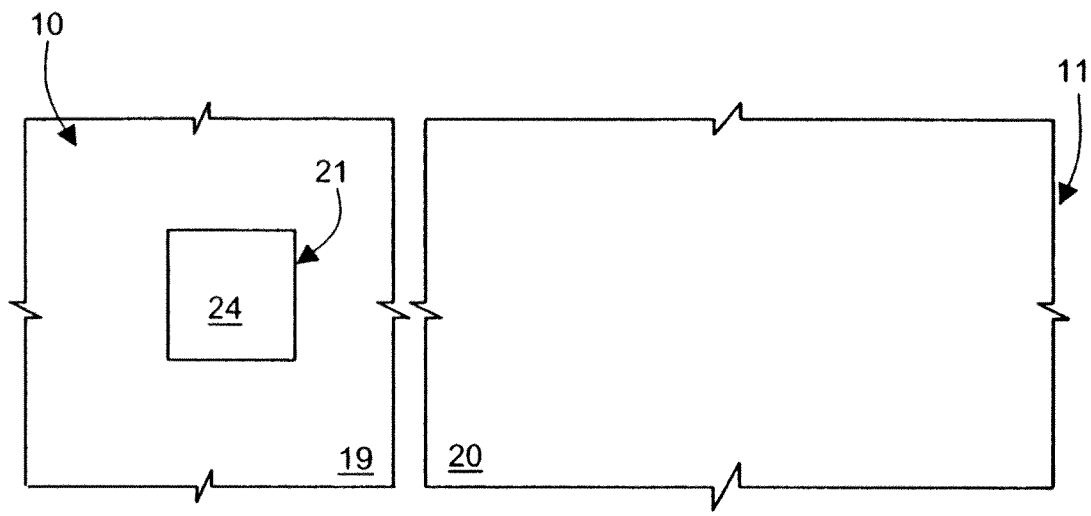
FIG. 5 shows a top plan view of the structure of FIG. 4.

Then (FIG. 4), a second nitride layer 20 is deposited. The second nitride layer 20 and the pad-oxide layer 16 are shaped in the first area 10 so as to form a mask (hard mask 24) having the shape desired for the channel region (here square). Next, the substrate 15 is etched in the first area 10, where exposed, as far as the buried layer 19, thereby forming a pillar 21 (as highlighted in the top view of FIG. 5). The etch brings about also a thinning of the hard mask 24, on account of the finite selectivity of the etch.

Figure 6:
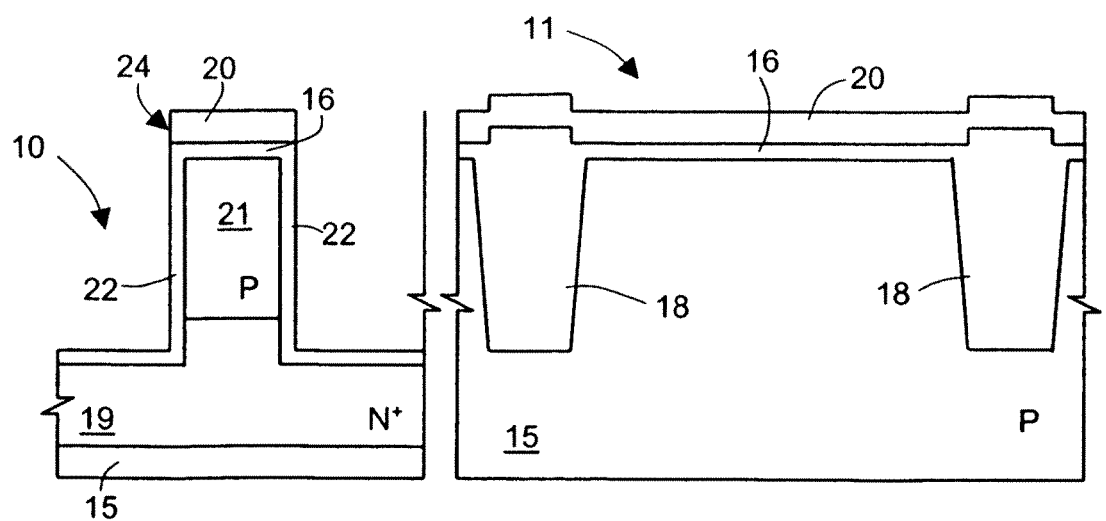
FIGS. 6-12 are cross-sections similar to FIG. 4, in successive process steps.

Next (FIG. 6), without removing the mask 24, a thermal oxidation is performed so as to grow a gate-insulation layer 22 on the walls of the pillar 21 and on the free surface of the buried layer 19.

Figure 7:
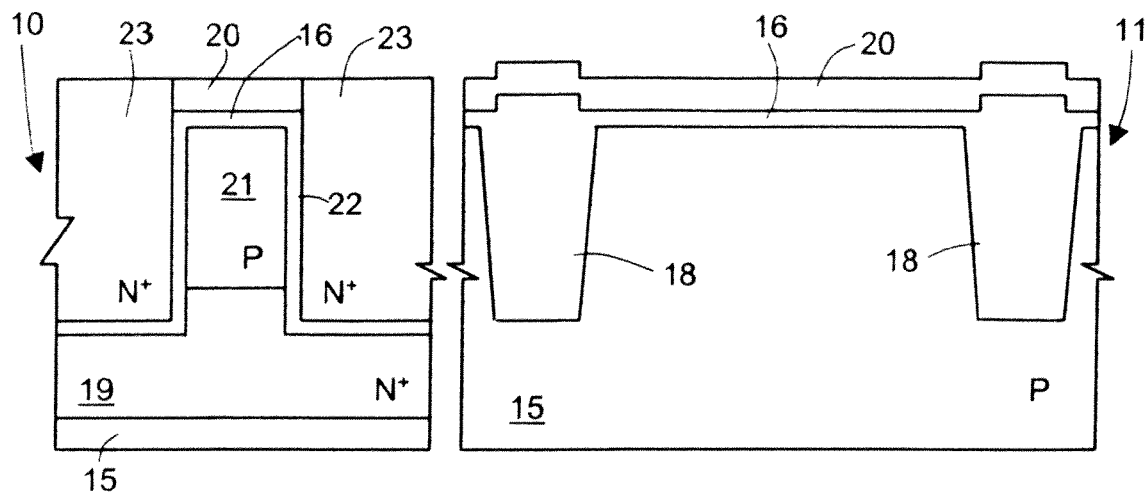

Then (FIG. 7), a polysilicon layer, of N+ type, is deposited. The polysilicon layer can be doped directly in situ or subsequently and is then removed for the excess portion, for example via a CMP (Chemical-Mechanical Polishing) step (which is interrupted on the second nitride layer 20). Thus, it is aligned vertically to the hard mask 24 and forms a lateral gate region 23 which surrounds the pillar 21.

Figure 8:
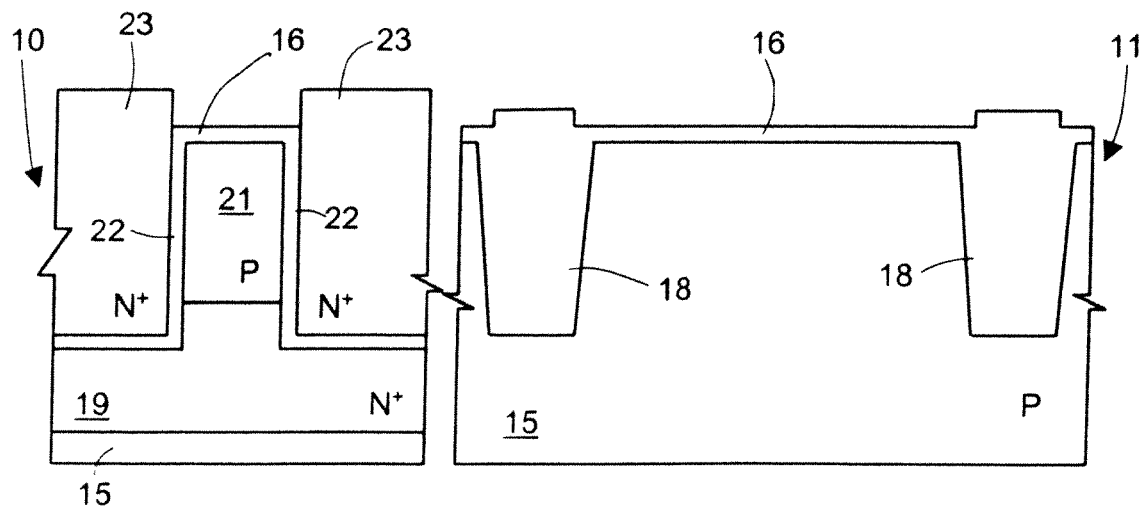
Figure 9:
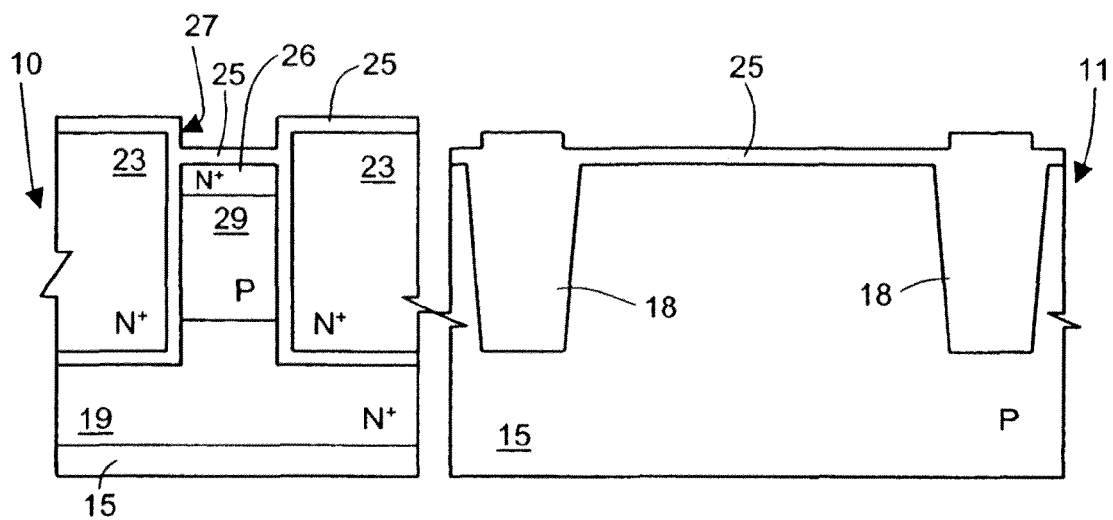

Next, the second nitride layer 20 (FIG. 8) is selectively removed and then the pad-oxide layer 16 is removed so eliminating the remaining portion of the hard mask 24.

Then, a surface oxidation is performed so forming a sacrificial-oxide layer 25 both on the first area 10 and on the second area 11. The removal of the mask 24 leaves, on the surface of the first area 10, a recess 27 which is not filled by the sacrificial-oxide layer 25. Next, in the top portion of the pillar 21, a masked implantation of dopant ions of N+ type is performed, thereby forming a vertical drain region 26 underneath the sacrificial-oxide layer 25 and on top of a portion of the pillar 21 defining a channel region 29.

Figure 10:
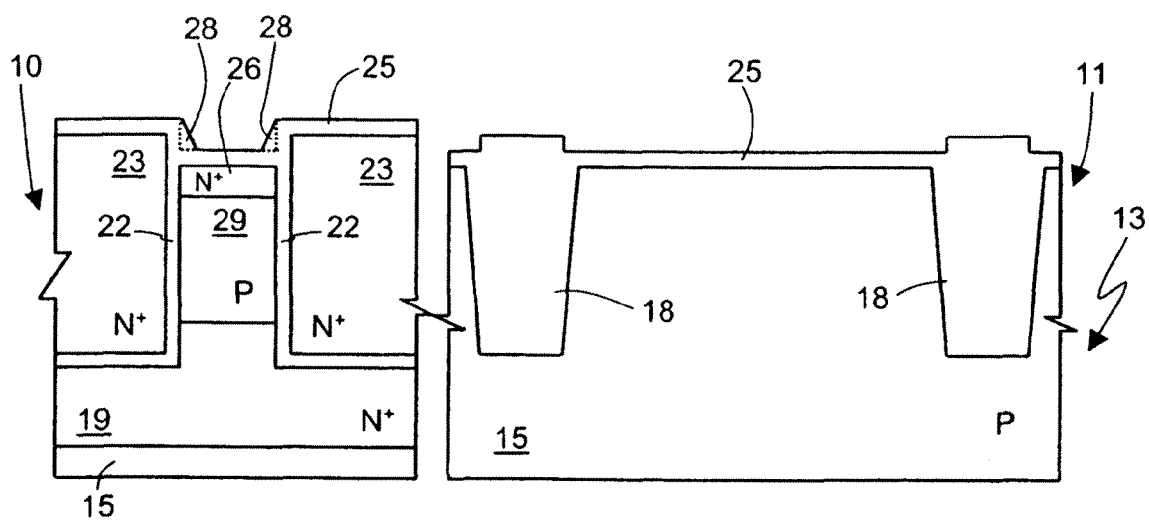

Next (FIG. 10) spacers 28 are provided on the edge of the recess 27. To this end, in a per se known manner, a silicon-oxide layer (or a silicon-nitride layer) is deposited, and is dry etched so as to remove it from the horizontal portions of the surface of the wafer 13. The spacers 28 are useful for providing a slight margin in regard to the drain|gate short-circuits, above all when titanium or cobalt silicides are used.

Figure 11:
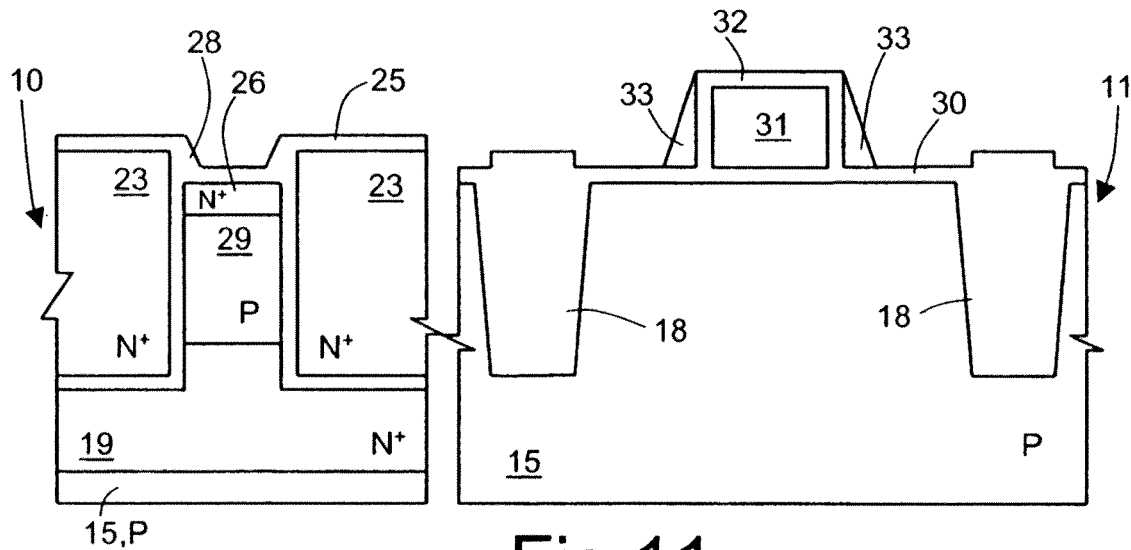

Then (FIG. 11), standard steps for manufacturing MOS-FET transistors are performed. In particular, in the second area 11, the sacrificial-oxide layer 25 is removed, a gate-oxide layer 30 is grown, and a polysilicon layer is deposited and shaped to form a gate region 31. During removal of the sacrificial-oxide layer 25 and definition of the polysilicon layer, the first area 10 is exposed to the treatments and its planarity preserves the morphology thereof.

A gate-insulation layer 32 is then provided, which surrounds the gate region 31, and spacers 33 are provided, for example of silicon nitride, at the sides of the gate region 31.

Next (FIG. 12), N+ implantations are performed in the second area 11 to form source and drain regions 34. Then, in both of the areas 10 and 11, the exposed portions of the oxide layers 25, 30 and 32 are removed; a silicidation is performed, with formation of regions of silicide (for example, titanium silicide); in particular, silicide regions 35a are formed on top of the source and drain regions 34, silicide regions 35b are formed on top of the gate region 31, silicide regions 35c are formed on top of the vertical drain region 26, and silicide regions 35d are formed on top of the lateral gate region 23. In this way, in the first area 10 a vertical transistor 40 is present, which includes the vertical drain region 26, the channel region 29 with vertical current flow, underneath the vertical drain region 26, the buried layer 19, defining a source region, and the lateral gate region 23, surrounding the pillar 21 and extending on the top the buried layer 19. The gate-insulation layer 22 insulates electrically the vertical drain region 26, the channel region 29 and the buried layer 19 from the lateral gate region 23. In the second area 11 a planar MOS transistor 45 is present, which includes the source/drain regions 34 and the gate region 31.

The source region (buried layer 19) can be shared by other adjacent vertical transistors 40 or form part of a single vertical transistor 40 (in this case, the masked implantation for forming the buried layer 19 uses a suitable mask to obtain the formation of one or more buried regions 19 having appropriate shape, size and position, and vertical insulations must be provided between the various vertical transistors 40). The width of the vertical transistor 40 is defined by the perimeter of the pillar 21 obtained by etch and can be thus controlled accurately.

Next, contacts are provided towards the various conductive regions.

Figure 13:
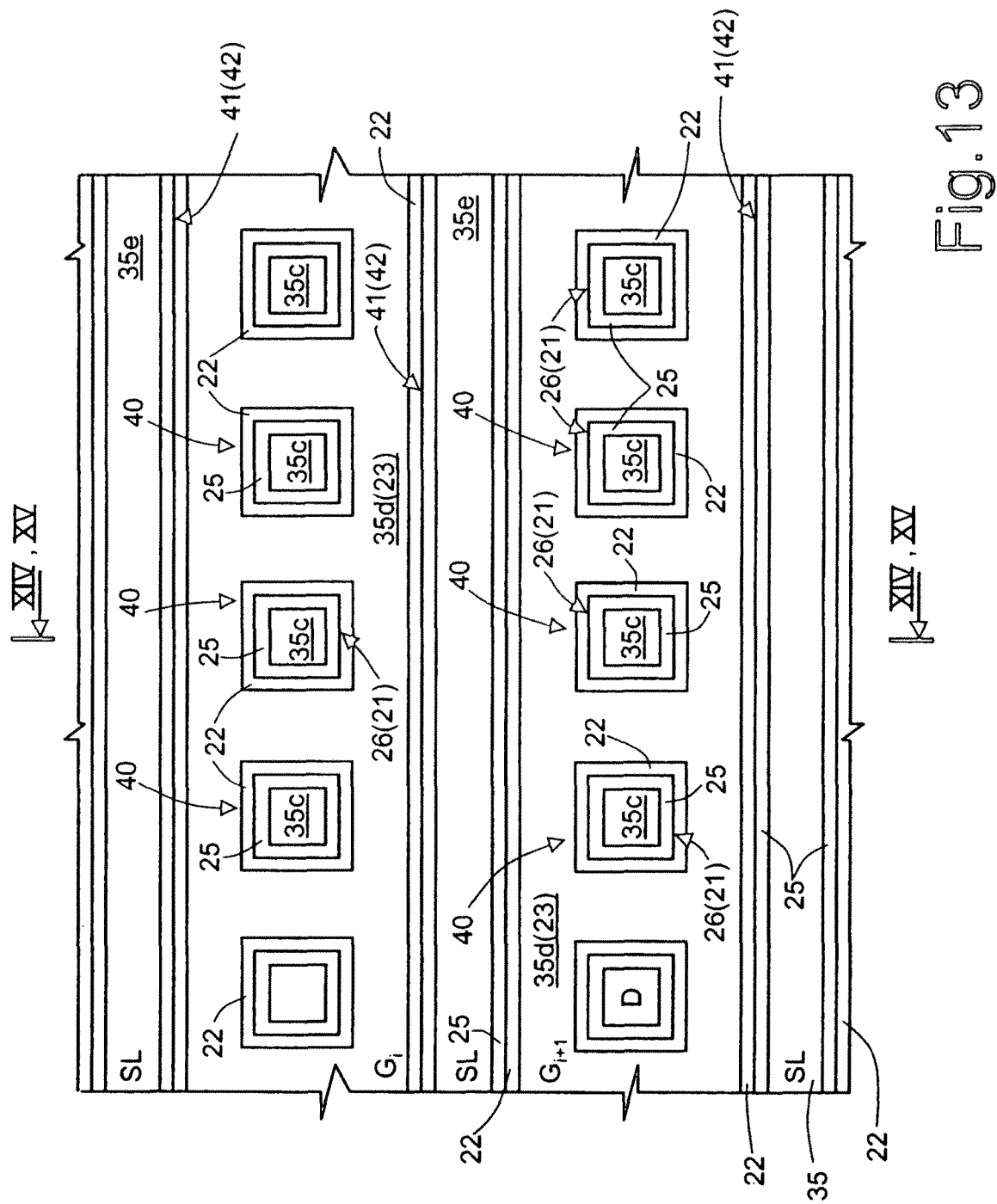
FIG. 13 is a horizontal cross-section of a part of the structures of FIGS. 14 and 15.

FIG. 13 shows a top view on the first area 10, in the case of an array of vertical transistors 40, usable as selection elements in a phase-change memory array, as described hereinafter. As may be noted, the pillars 21 (the silicided regions 35c whereof, associated to the vertical-drain regions 26, are visible in FIG. 13) are aligned along rows. Source contact regions 41 are formed between each row of pillars 21 by the surfacing portions of the substrate 15, which are not removed during the etching for defining the pillars 21 (designated by 42 in FIG. 14) and are doped with an N+ dopant (for example, while forming the source and drain regions 34). The source contact regions 41 are moreover coated on the top by silicide regions 35e. The source contact regions 41 are electrically insulated from the lateral gate regions 23 by portions of the gate insulation layers 22.

On top of the vertical transistors 40 of FIG. 13, the phase-change memory elements are then provided, which, in this application, comprise a heating element and a calcogenic element.

Figure 14:
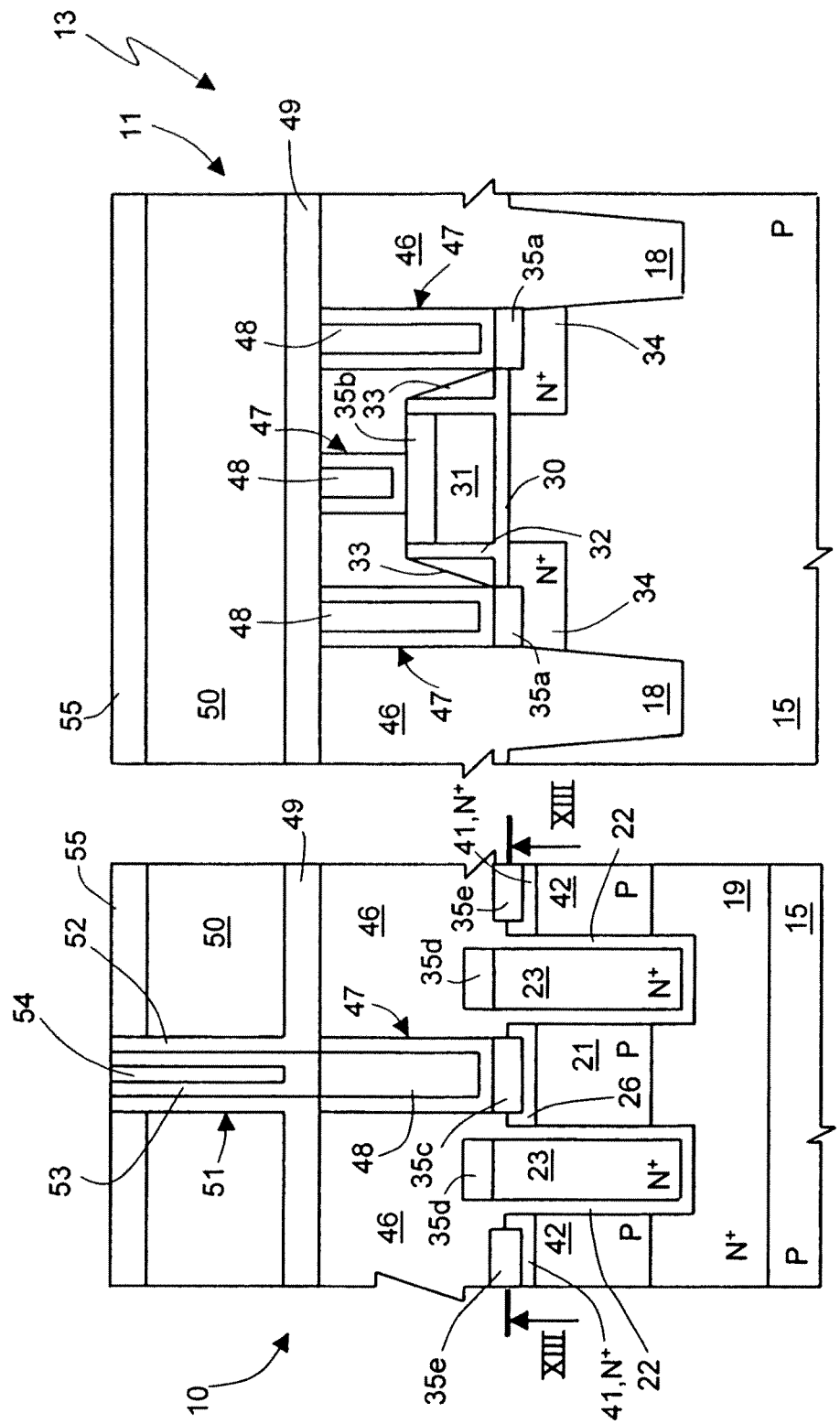
FIG. 14 is a cross-section similar to FIG. 12, in a subsequent manufacturing step.

FIG. 14 shows a first embodiment wherein a heating element is formed on top of a vertical transistor 40, in a second level. Here, a first dielectric material layer 46 (for example, of silicon oxide) is deposited on top of the wafer 13 and etched to form vias 47 for the contacts. In particular, in the first area 10 a via 47 extends on top of the vertical drain region 26 as far as the silicide region 35c and the via is filled by a contact 48 (here formed by a double Ti/TiN layer and by tungsten); in the second area 11, vias 47 extend as far as the silicide regions 35a overlying the source/drain regions 34 and the silicide regions 35b overlying the gate region 31.

A second dielectric material layer 49 (for example, silicon nitride) and a third dielectric material layer 50 (for example, silicon oxide) are deposited on top of the first dielectric layer 46. A glue layer 55 is deposited on top of the layers 49, 50, and the layers 49, 50 and 55 are etched in the first area 10 on top of the vertical transistor 40 so as to form a via 51 extending as far as the contact 48. The walls of the via 51 are coated with a spacing layer 52, for example of silicon nitride. Next, a resistive layer 53 (for example, of TiSiN, TiAlN or TiSiC) is sputtered, preferably by CVD (Chemical Vapor Deposition), and the via 51 is closed by a filling material 54, for example silicon oxide, preferably by ALD (Atomic-Layer Deposition). The structure is then planarized, for example via CMP, to remove the portions of the layers 52, 53, 54 projecting from the via 51. In this way, the remaining portions of the resistive layer 53 form a ring-shaped heater.

Figure 15:
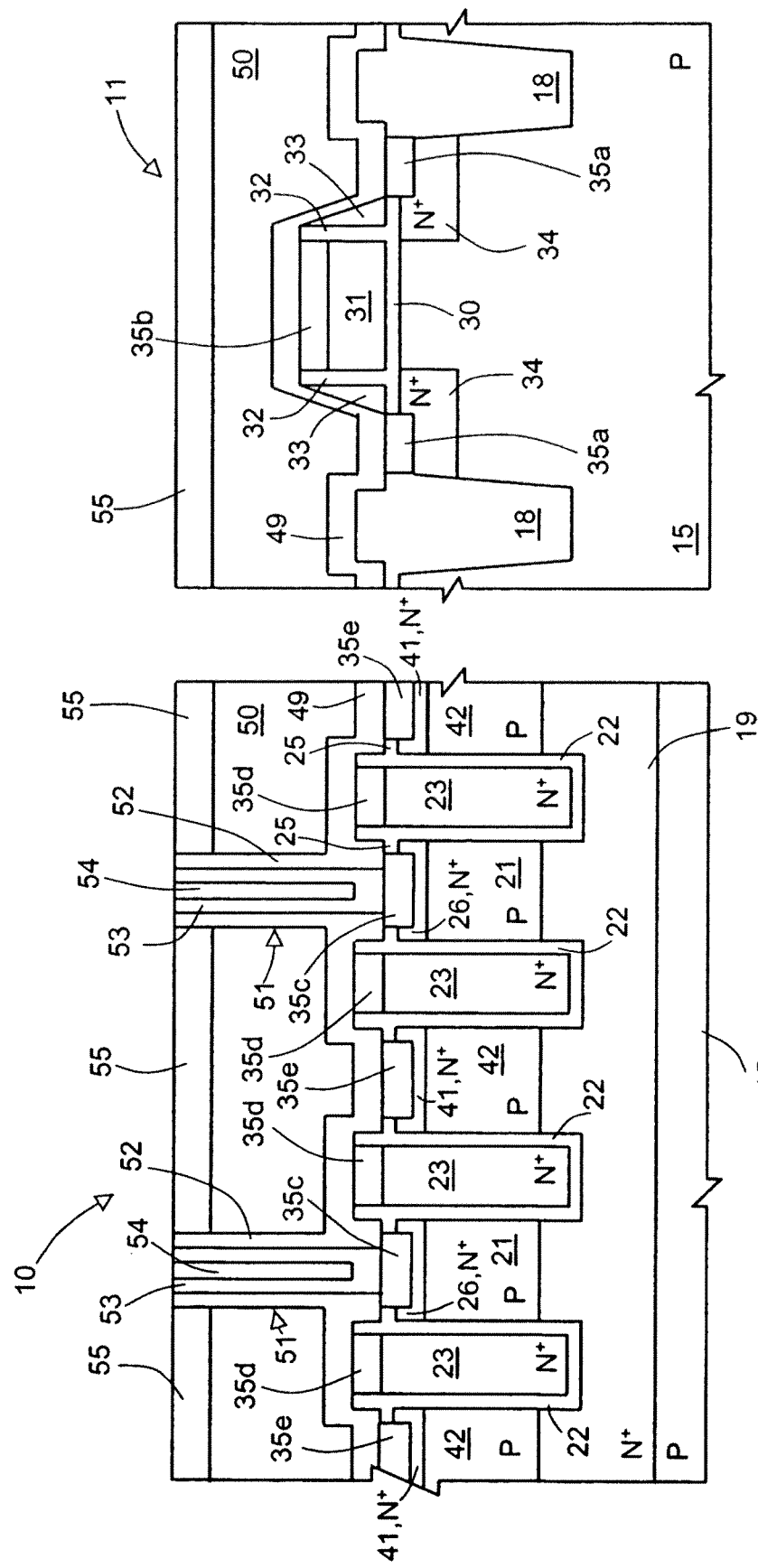
FIGS. 15-17 are cross-sections of another embodiment of the invention, in successive manufacturing steps.

FIG. 15 illustrates, instead, an embodiment wherein the heating element 53 is formed directly on top of a vertical transistor 40. In this embodiment, the first dielectric material layer 46, the via 47 and the contact 48 are consequently absent; the contacts towards the transistor are formed subsequently.

Figure 16:
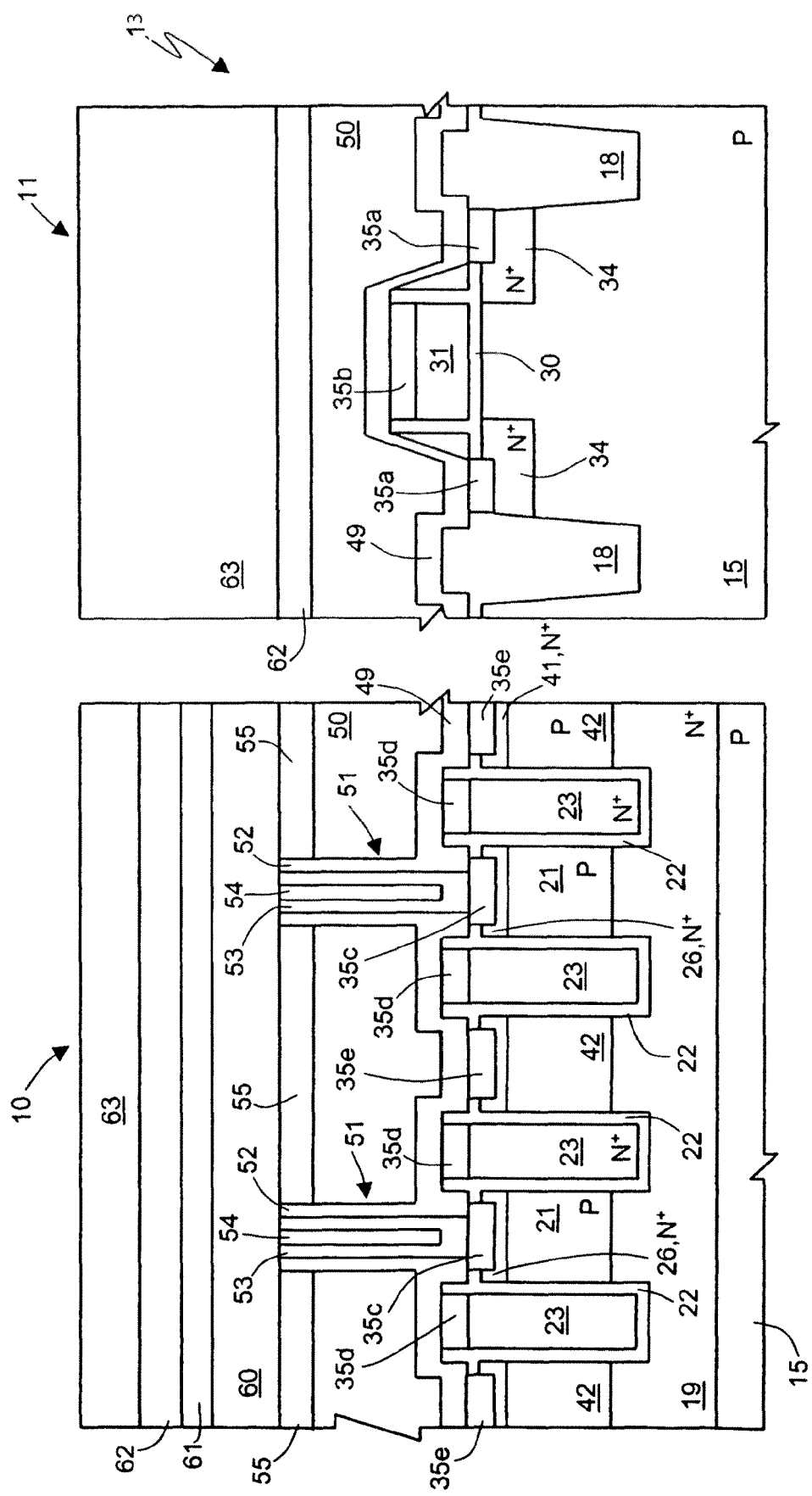

With reference to the embodiment of FIG. 15, a memory layer 60, a calcogenic material layer (for example, $Ge_2Sb_2Te_5$), and a cap layer 61 (for example, $Ti_xAl_yN_z$, $Ti_x$-$Si_yN_z$ or $Ti_xN_y$) are then deposited in succession (FIG. 16). The layers 61, 60 and 55 are then defined, forming bitlines 59 that extend parallel to the plane of the drawing (as viewed in FIG. 19). While defining the bitline 59, the adhesive material 55 is completely removed from the second area 11.

Next, a sealing layer 62, for example, of silicon nitride, and a fourth dielectric material layer 63, for example of silicon oxide, are deposited and planarized so as to coat completely the layers 60 and 61. Then, the fourth dielectric material layer 63 is planarized via CMP.

Figure 17:
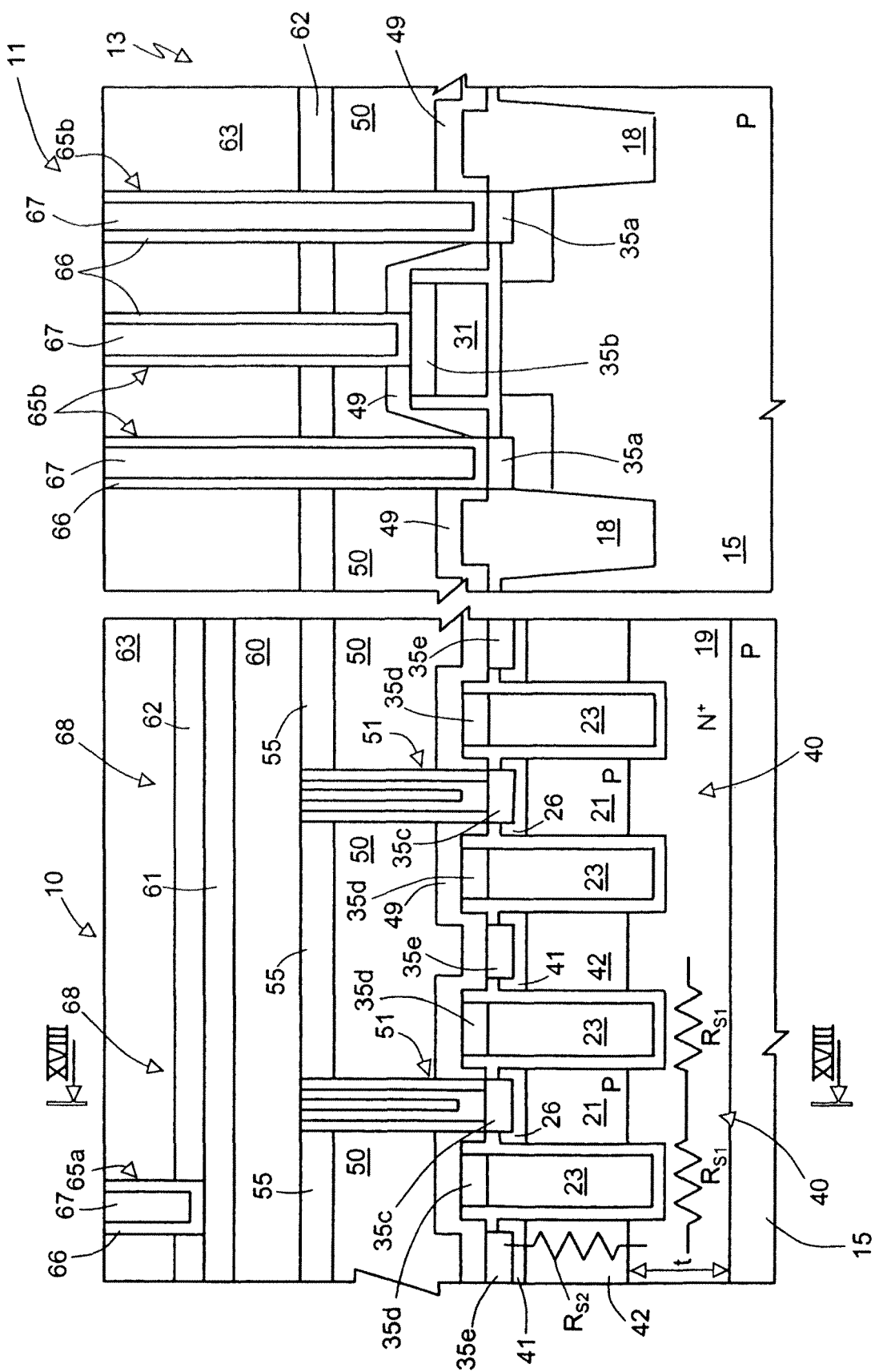

Next (FIG. 17), first and second openings 65a and 65b are made in the first area 10 and in the second area 11, respectively, via two separated etches. Specifically, in the first area 10, the openings 65a traverse the entire fourth dielectric material layer 63 and the sealing layer 62, reaching the cap layer 61. In the second area 11, the openings 65b traverse the fourth dielectric material layer 63, the sealing layer 62, the third dielectric material layer 50 and the second dielectric material layer 49 and reach the silicide regions 35a, 35b. The openings 65a, 65b are then coated by a barrier layer 66, for example of TaN/Ta, and filled by depositing a metal layer 67, here Cu. After planarization of the wafer 13, the structure illustrated in FIG. 17 is thus obtained, which is then subjected to the typical final steps. As a result, a plurality of memory elements 68 is obtained, each of which is arranged on top of a respective vertical transistor 40 that operates as selection element.

FIG. 18 shows a section perpendicular to that of FIG. 17, taken along the line XVIII-XVIII. In particular, in FIG. 18, the bitlines 59 formed by the layers 60, 61 and by the underlying portions of the glue layer 55 may be noted.

FIG. 19 shows a top plan view of the structure of FIGS. 17 and 18, with some layers removed for sake of clarity. In particular, FIG. 19 shows the buried source resistance Rs1, i.e., the resistance existing along the buried layer 19 between the channel region 29 and each portion of substrate 42 (see also FIG. 17).

In this case, the buried source resistance Rs1 is equal to:

$$R_{S1} \approx \rho^* \ln(1+2^*h/d)/(2^*t) \approx 0.25^* \rho_{N+}/t$$

where ρ is the resistivity of the buried layer 19, t its thickness (see FIG. 17), h the length traversed by the current along the buried layer 19, and d the minimum width of the current path (see FIG. 19).

The total resistance Rt encountered by the current coming from the channel region 29 and directed towards the source contact region 41 is hence equal to Rs1+Rs2, where Rs2 is the source vertical resistance, i.e., the resistance encountered by the current along the substrate portions 42.

Figure 20:
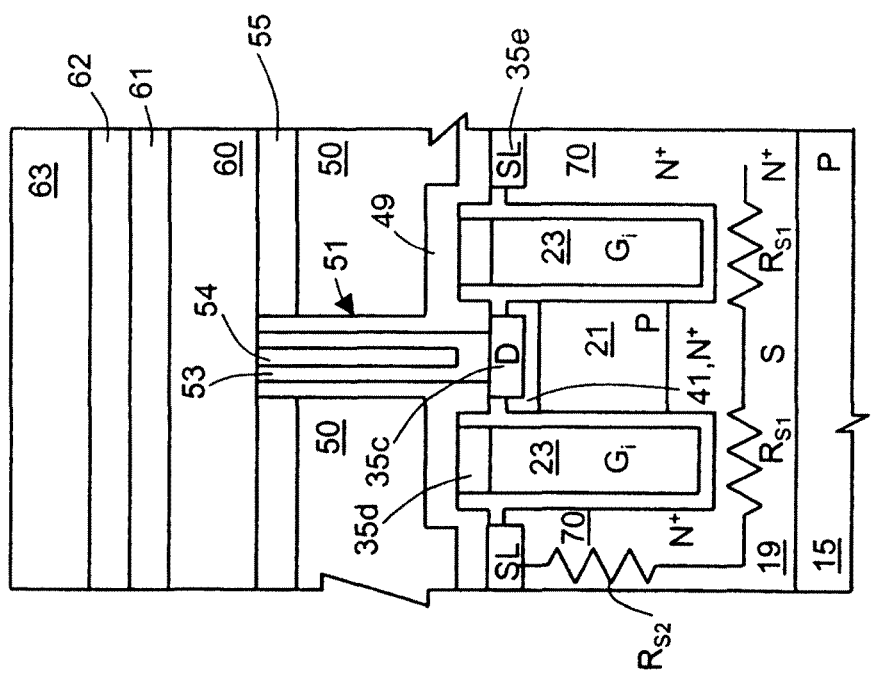
FIG. 20 is a cross-section of another embodiment of the invention.

To reduce the total resistance Rt, it is possible to perform an N+ source-line implantation, as illustrated in FIG. 20. This implantation can be performed as dedicated implantation of an N+ type or exploiting the N-well implant normally performed during the fabrication of planar MOSFETs. In either case, N+ regions 70 connect the source contact region 41 to the buried layer or region 19.

Figure 21:
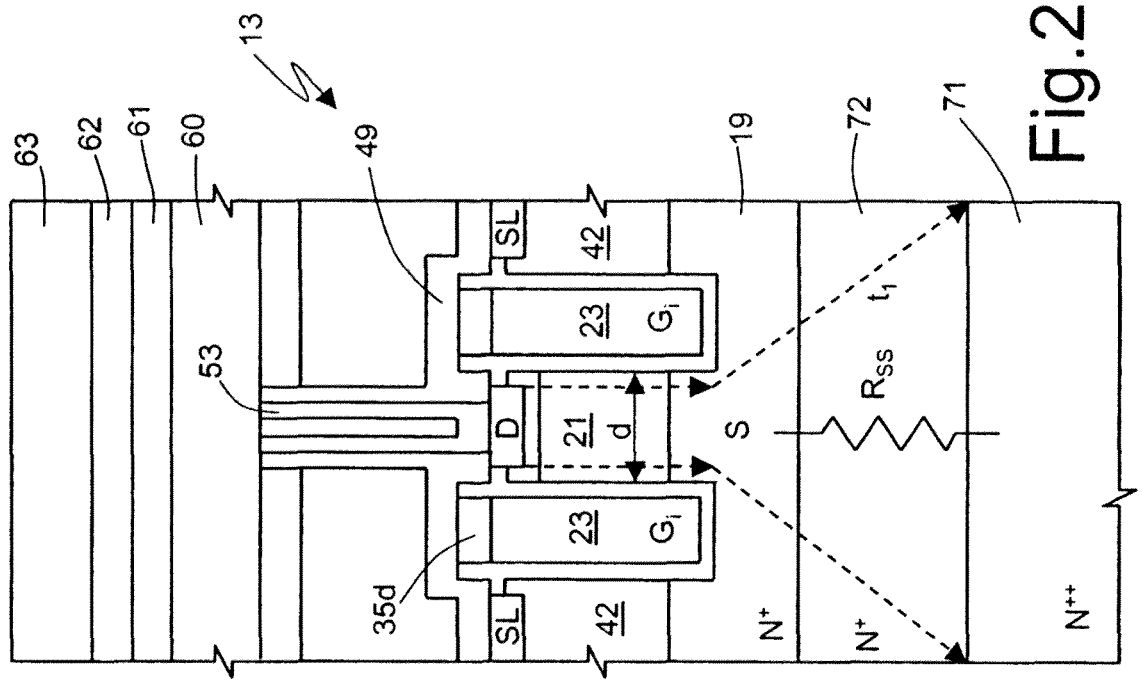
FIG. 21 is a cross-section of a different embodiment of the invention.

According to another embodiment, it is possible to exploit an N+ substrate underneath the substrate 15, when this is present. This possibility is illustrated in FIG. 21, which represents an area of the wafer 13 underlying the buried layer 19 where an N+ substrate 71 is present, having, for example, a doping level of approximately $10^{19}$ at/cm². In this case, in an initial manufacturing step of the wafer 13, a sub-source implantation is performed so as to connect the N+ substrate 71 to the buried layer 19. For example, phosphorus can be used at an implantation dose of $10^{14}$ at/cm² with an energy of between 300 and 1000 keV to form a sub-source layer 72 of N+ type. Next, an annealing is performed so as to reduce any possible damage of the silicon.

In this case, the resistance Rss between the buried layer 19 and the N+ substrate 71 is equal to:

$$R_{SS} = \rho_{N+}^* t1/(d^*(d+t1)) \approx \rho_{N+}/d$$

where $\rho_{N+}$ is the resistivity of the sub-source layer 72 and d is the minimum width of the current path (see FIG. 19). In this embodiment the current path is indicated by dashed arrows in FIG. 21.

Yet a further possibility consists in maintaining the standard P substrate 15 (portion of substrate 42) and forming a vertical PMOS. In this case, however, the reduced mobility of the holes would require a greater overdrive (namely, the source-gate voltage necessary for turning on the device) to obtain the same currents and hence a higher gate voltage or, alternatively, a larger perimeter (with a consequent increase in the area occupied).

The advantages of the vertical transistor described are the following. First, the vertical transistor is practically as compact as known transistors ($15F^2$ as against $10F^2$ of PNP bipolar junction transistors, where F is the minimum lithographic dimension that can be obtained for the specific used technology), but uses just two dedicated masks and does not present any dissipation when it is not selected. As compared to FinFET transistors, the present vertical transistor has the same compactness but uses fewer dedicated masks (two, instead of three or four).

The described vertical transistor has a much greater driving capacity (three or four times) as compared to planar MOSFETs, for a same area.

The process steps necessary for manufacturing the vertical transistor can be included conveniently in a CMOS process between the well implantations and the gate-oxide growth.

The described vertical transistor can be readily integrated in array structures and can hence advantageously be used in phase-change memories as a selection element.

Figure 22:
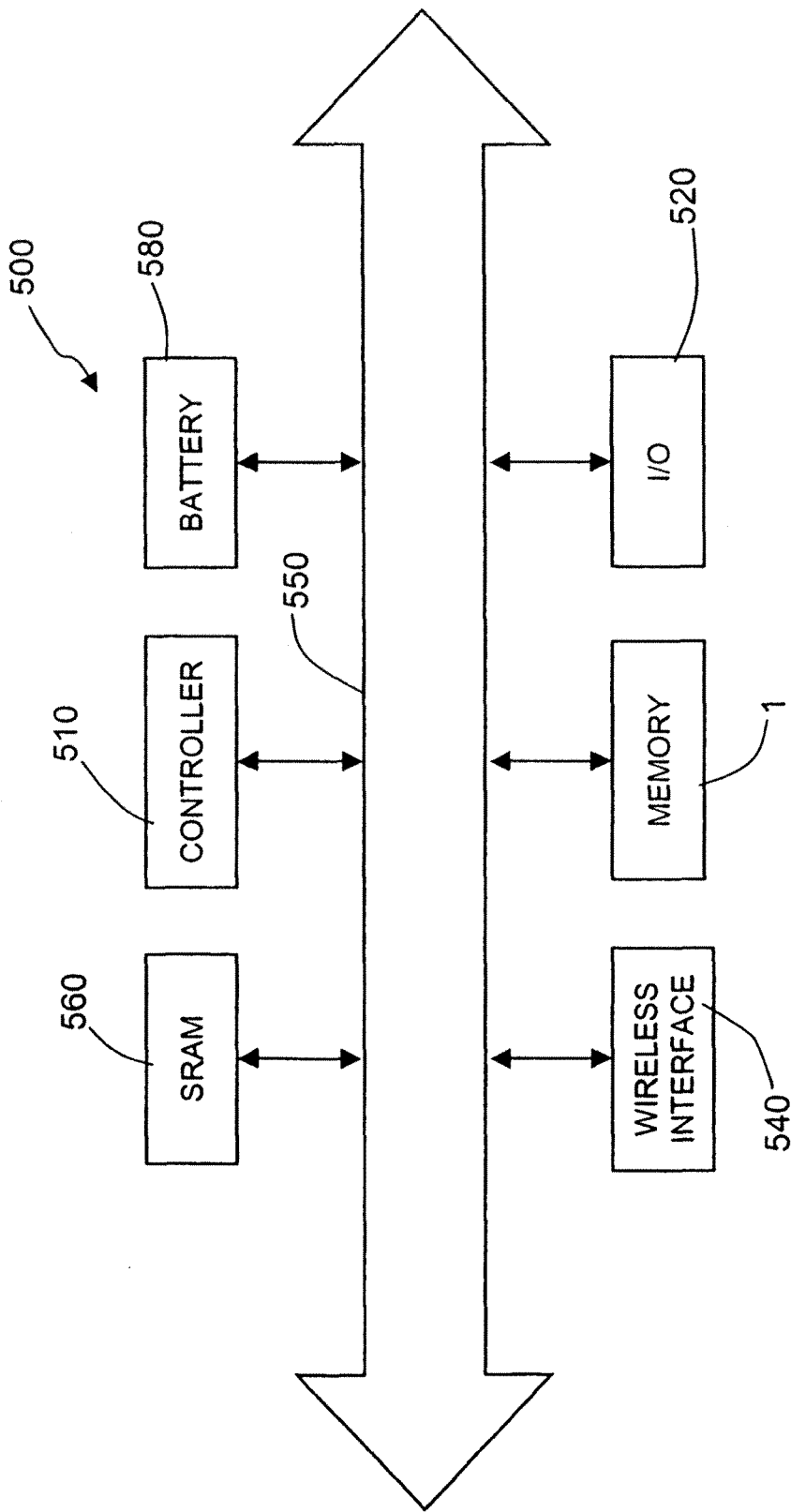
FIG. 22 represents a system according to an embodiment of the present invention.

With reference to FIG. 22, a description of a portion of a system 500 according to an embodiment of the present invention now follows. The system 500 can be used in wireless devices such as, for example, a PDA (personal digital assistant), a laptop or portable computer with wireless capacity, a web tablet, a wireless telephone, a pager, a device for sending messages instantaneously, a digital music player, a digital camcorder, or other devices that can be suited for transmitting and/or receiving information in wireless mode. The system 500 can be used in any one of the following systems: a WLAN (wireless local-area network) system, a WPAN (wireless personal-area network) system, or a cell phone network, even though the scope of the present invention is not limited in this connection.

The system 500 can include a controller 510, an input/output device I/O 520 (for example a keypad or a display), a memory 1, a wireless interface 540, and a SRAM (static random-access memory) 560, connected together via a bus 550. A battery 580 can supply the system 500 in one embodiment. It is emphasized that the scope of the present invention is not limited to embodiments that have some or all of these components.

The controller 510 can comprise, for example, one or more microprocessors, digital-signal processors, microcontrollers, or the like. The memory 1 can be used for storing messages transmitted by a system 500 or received thereby. The memory 1 can optionally be used also for storing instructions that are executed by the controller 510 during operation of the system 500, and can be used for storing user data. The instructions can be stored as digital information, and the user data, as described herein, can be stored in one section of the memory as digital data and, in another section, as analog data. In another example, a given section at a time can be labeled and store digital information, and then can be re-labeled and reconfigured for storing analog information. The memory 1 can be provided with one or more types of memory. For example, the memory 1 can comprise a volatile memory (any type of random-access memory) and a nonvolatile memory such as a flash memory and/or a crosspoint memory.

The I/O device 520 can be used for generating a message. The system 500 can use the wireless interface 540 for transmitting and receiving messages to and from a wireless communication network with a radiofrequency (RF) signal. Examples of wireless interfaces 540 can include an antenna or a wireless transceiver, such as a dipole antenna, even though the scope of the present invention is not limited thereto. Furthermore, the I/O device 520 can supply a voltage correlated to what is stored either as digital output (if digital information has been stored) or as analog information (if analog information has been stored).

Even though an example of a wireless application has been provided above, embodiments of the present invention can also be used in non-wireless applications.

Finally, it is clear that numerous modifications and variations can be made to the vertical transistor described and illustrated herein, all falling within the scope of the invention, as defined in the attached claims. In particular, even though the foregoing description refers to the manufacture of a vertical NMOS transistor, by appropriately modifying the dopants and starting materials, it is possible to provide also PMOS transistors, using the same process sequence.

Figure 12:
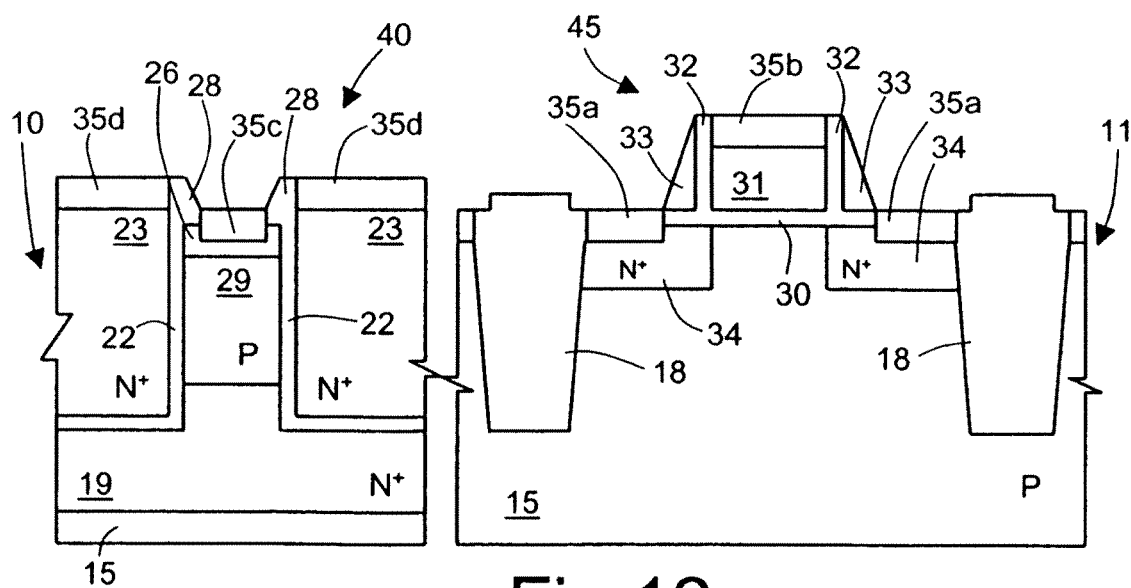

Furthermore, even though the structure of the illustrated vertical transistor has an approximately axial symmetry, with the gate insulation region (gate-insulation layer 22) completely surrounding the channel region 29 and with the lateral gate region 23 completely surrounding the gate insulation region, it is also possible to use a solution wherein both the lateral gate region 23 and the gate-insulation layer 22 are arranged only on one side of the channel region 29 or on two opposite sides thereof (for example, with the channel region 29 formed by a region elongated in the direction perpendicular to the plane of FIG. 12), and other insulating regions are present for guaranteeing the necessary electrical insulation between the various regions.

Even though the silicide regions 35c-35e are useful to reduce the resistance, in some applications, for example in the case of technology that does not envisage silicided regions, they can be omitted.

As regards the fabrication of a phase-change memory, the structure of the heater 53 can also differ with respect to that illustrated, and the heater 53, instead of having the ring conformation illustrated (ring-shaped memory region formed by the intersection between the resistive layer 53 and the memory layer 60), can have an elongated (wall-like) shape or any other suitable shape. Likewise, the region of memory formed by the layer 60 can be configured differently; for example, it can be made according to the minitrench technique (memory layer 60 deposited in trenches formed in the fourth layer of dielectric material 63 and shared by two adjacent memory cells) or according to the lance technique (memory layer 60 deposited in openings formed in the fourth layer of dielectric material 63 and provided with spacers for reducing the area of the openings to sublithographic dimensions).

It is moreover pointed out that the glue layer 55 is not essential and may be absent.

Finally, the vertical transistors 40 can be used as selection elements for different types of memory, which use elements for storing information based upon physical mechanisms other than the phase change of the PCMs.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory cell comprising:
   a vertical transistor comprising a surface conduction region;
   a ring shaped heater coupled to the surface conductive region through a multiple layer contact, the multiple layer contact comprising a via formed vertically in a dielectric layer, the via filled by a plurality of materials to form the multiple layer contact; and
   a phase change memory element comprising a chalcogenic layer formed directly in contact with an entire top surface area of the ring-shaped heater with no intervening layers.

2. The memory cell of claim 1, wherein a dielectric material fills an interior of the ring-shaped heater.

3. The memory cell of claim 2, wherein the surface conductive region is of the first conductivity type and is in a body of the vertical transistor and arranged on top of a channel region and a buried conductive region of the vertical transistor.

4. The memory cell of claim 3, wherein the buried conductive region is a source region of the vertical transistor and the surface conductive region is a drain region of the vertical transistor.

5. The memory cell of claim 3, wherein a gate insulation region of the vertical transistor completely laterally surrounds a channel region and a gate region completely laterally surrounds a gate insulation region.

6. The memory cell of claim 5, wherein the gate insulation region and the gate region extend on two sides of the channel region.

7. The memory cell of claim 5, wherein the buried conductive region, the channel region and at least part of the surface conductive region comprise monocrystalline material and at least part of the gate region comprises polycrystalline material.

8. The memory cell of claim 1, wherein the surface conductive region comprises a first semiconductor material region and a first metal silicide region arranged on top of the first semiconductor material region.

9. A memory cell comprising:
   a phase change memory element coupled to a surface conductive region of a vertical transistor,
   wherein the phase change memory element comprises a chalcogenic layer; and
   a ring-shaped heater coupled to the surface conductive region through a multiple layer contact, the multiple layer contact comprising a via formed vertically in a dielectric layer of the vertical transistor, the via filled by a plurality of materials to form the multiple layer contact, wherein the chalcogenic layer is directly in contact with an entire top surface area of the ring-shaped heater with no intervening layers.

10. The memory cell of claim 9, wherein the plurality of materials comprise Ti or TiN.

11. The memory cell of claim 10, wherein the Ti or TiN material comprises a double layer of Ti/TiN and tungsten.

12. The memory cell of claim 9, wherein the via extends as far as a silicide region overlying source/drain regions of the vertical transistor.

13. The memory cell of claim 12, wherein a second silicide region overlies a gate region of the vertical transistor.

14. The memory cell of claim 13, wherein the gate region comprises a semiconductor material region and a metal silicide region, the metal silicide region being arranged on top of the semiconductor material region.

15. The memory cell of claim 9, wherein the ring shaped heater is provided with a second via and the walls of the second via are coated with a spacing layer.

16. The memory cell of claim 15, wherein the spacing layer comprises silicon nitride.

17. The memory cell of claim 16, wherein the second via further comprises a resistive layer.

18. The memory cell of claim 17, wherein the resistive layer comprises at least one of TiSiN, TiAlN, or TiSiC.

19. The memory cell of claim 18, wherein the second via further comprises a filling material.

20. The memory cell of claim 19, wherein the filling material comprises silicon oxide.

* * * * *